US006236599B1

United States Patent
Goto

(12) United States Patent
(10) Patent No.: US 6,236,599 B1
(45) Date of Patent: May 22, 2001

(54) REPAIR SIGNAL GENERATING CIRCUIT

(75) Inventor: Koji Goto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/610,951

(22) Filed: Jul. 6, 2000

(30) Foreign Application Priority Data

Jan. 25, 2000 (JP) .................................. 12-016201

(51) Int. Cl.[7] ....................................................... G11C 7/00
(52) U.S. Cl. ....................... 365/194; 365/200; 365/225.7; 365/230.08
(58) Field of Search .................... 365/194, 200, 365/225.7, 230.08

(56) References Cited

U.S. PATENT DOCUMENTS 5,297,086 * 3/1994 Nasu et al. ........................... 365/200
5,345,422 * 9/1994 Redwine ......................... 365/189.09
5,689,465 * 11/1997 Sukegawa et al. ................... 365/200
5,852,580 12/1998 Ha ....................................... 365/200

FOREIGN PATENT DOCUMENTS 10-199278 7/1998 (JP) .
11-176945 7/1999 (JP) .

* cited by examiner

Primary Examiner—Richard Elms
Assistant Examiner—Tuan T. Nguyen
(74) Attorney, Agent, or Firm—Leydig, Voit & Mayer, Ltd.

(57) ABSTRACT

In a repair signal generating circuit, a first p-channel transistor has its source connected to a power supply, and a reset signal is input into its gate. An n-channel transistor has its source connected to a terminal of a grounded fuse, its drain connected to the drain of the first p-channel transistor, and the reset signal is input into its gate. A second p-channel transistor has its drain connected to the drains of the first p-channel transistor and the n-channel transistor, and its source connected to the power supply. The on-resistance of the second p-channel transistor is higher than that of the n-channel transistor. An inverter has its input terminal connected to the drains of the first p-channel transistor and the n-channel transistor, and its output terminal, where a repair signal is output, connected to the gate of the second p-channel transistor.

5 Claims, 5 Drawing Sheets

REPAIR SIGNAL GENERATING CIRCUIT

FIELD OF THE INVENTION

The present invention relates to a repair signal generating circuit which is mounted onto a semiconductor integrated circuit and generates a repair signal for instructing that a malfunction occurring in a fabricating process of the semiconductor integrated circuit be replaced by a redundant circuit.

BACKGROUND OF THE INVENTION

Very fine processing is progressing due to the development of recent semiconductor process techniques. Accordingly, the degree of integration of semiconductor integrated circuits is also increasing abruptly which leads to an increase in the circuit scale. Moreover, recently, in order to produce effects such that an increase in a memory and low power consumption, a logic circuit and a large-scale memory device are mounted together onto one semiconductor chip.

When large-scale system circuits are mounted onto one semiconductor chip, a small area of a system substrate and low power consumption at the time of mounting a semiconductor device in a system apparatus can be attained. However, from the viewpoint of the fabrication of a semiconductor integrated circuit, the transistor density per unit area increases, and the chip area also increases. Accordingly, the defect factor of the wafer increases thereby causing deterioration of yield of the semiconductor chip.

Therefore, in the case where a portion of the circuit on a semiconductor chip, for example, a portion of the memory circuit is defectively produced in the fabricating process, a redundant circuit having a function equivalent to the defective circuit is previously mounted onto the same semiconductor chip, and a part of the redundant circuit is replaced with the defective circuit by a switching circuit. Sometimes the defective circuit is completely replaced with the redundant circuit. As a result, the defective circuit is not used, therefore, the yield of the semiconductor chip is improved.

As a method of replacing the defective circuit with the redundant circuit, there exists a laser trimming method utilizing a fuse, for example. One terminal of a fuse is connected with a power supply of a semiconductor integrated circuit or a ground node, and the other terminal is connected with a repair signal generating circuit which generates a repair signal. This repair signal indicates whether or not a defective circuit is replaced.

In the laser trimming method, a semiconductor integrated circuit is first tested, and when a defective portion or defective block is identified, a fuse of the specified defective portion or block is cut by a laser trimming device. When the fuse is cut, the repair signal generating circuit is actuated so that a repair signal output from the repair signal generating circuit is inverted. The defective portion or block is replaced with a redundant circuit having a function equivalent to the defective portion or block based on the inverted repair signal so that the yield of the large-scale semiconductor integrated circuit is improved.

FIG. 5 is a diagram showing a configuration of a conventional repair signal generating circuit using a fuse. This repair signal generating circuit outputs a high level repair signal OUT when a fuse 103 is connected, and outputs a low level repair signal OUT when the fuse 103 is cut.

As shown in FIG. 5, when the fuse 103 is connected, that is, is not cut, since the grounded fuse 103 is connected with an input of an inverter 104, a low level signal is input into the inverter 104. Accordingly, the inverter 104 outputs a high level signal. The output of the inverter 104 is output as the repair signal OUT and also input into a gate of a p-channel transistor 102. When the high level signal from the inverter 104 is input into the gate of the p-channel transistor 102, the p-channel transistor 102 becomes OFF.

In this state, when the fuse 103 is cut by the laser trimming device or the like, the input side of the inverter 104 becomes a floating node which is electrically isolated. Here, when power is supplied to the semiconductor integrated circuit to which this repair signal generating circuit is mounted, one terminal of a capacitor 101 is dragged abruptly to a high level, that is, electric charge from the capacitor 101 is discharged, and an electric charge which corresponds to the discharge of the electric charge is again allocated and simultaneously the electric potential changes at the node of the inverter 104 on the input side.

When the node of the input side of the inverter 104 is at high level once, the inverter 104 outputs a low level signal, and the low level repair signal is input into the gate of the p-channel transistor 102 so that the p-channel transistor 102 becomes ON. When the p-channel transistor 102 is ON, the voltage level of a power supply Vcc, that is, the high level repair signal is input into the inverter 104, and thereafter the p-channel transistor 102 is maintained in the ON state so as to serve as a latching circuit in which the low level repair signal output from the inverter 104 is held.

As a result, in the case where the fuse 103 is not cut, the repair signal generating circuit outputs the high level repair signal to a not shown switching circuit, and in the case where the fuse 103 is cut, outputs the low level repair signal to the switching circuit.

However, in the above-mentioned conventional repair signal generating circuit, since capacitance of a capacitor 101 is raised by the cutting of the fuse 103, the voltage of the input side of the inverter 104 is not sufficiently raised depending on whether the repair signal generating circuit is fabricated well or poorly. Accordingly, there arises a problem that the cut state of the fuse 103 cannot be detected securely.

In addition, when the fuse 103 is not cut completely, a very weak electric current flows in the fuse 103, and the power consumption cannot be lowered.

SUMMARY OF THE INVENTION

It is an object of the present invention to provide a repair signal generating circuit outputting a repair signal which represents whether a fuse is cut, relieving a circuit having a defective portion securely, and lowering power consumption.

In order to achieve the above object, a repair signal generating circuit according to one aspect of the present invention comprises a power supply; a first p-channel transistor, which first p-channel transistor having a source, a gate, and a drain, wherein said source is connected with said power supply, and a reset signal is input into said gate; a fuse whose one terminal is grounded; an n-channel transistor, which n-channel transistor having a source, a gate, and a drain, wherein said source is connected with the other terminal of said fuse, the reset signal is input into said gate, and said drain is connected with said drain of said first p-channel transistor; a second p-channel transistor, which second p-channel transistor having a source, a gate, and a drain, wherein said source is connected with said power supply, said drain is connected with a node between said commonly connected drains of said first p-channel transistor and said n-channel transistor, said second p-channel transistor having an on-resistance higher than that of said n-channel transistor; and an inverter, which inverter having an input terminal and an output terminal, wherein said input terminal is connected with the node between said commonly connected drains of said first p-channel transistor and said n-channel transistor, and said output terminal is connected with the gate of said second p-channel transistor, said inverter outputting a repair signal from said output terminal.

According to the above invention, initialization is carried out in such a manner that when a reset signal representing the reset-on state is input into the gates of the first p-channel transistor and n-channel transistor, an electric potential level obtained by inverting the reset signal is generated at the node, and the closed loop which is composed of the second p-channel transistor and the inverter latches the electric potential level and a repair signal having an electric potential level obtained by inverting the electric potential level is output from the inverter. When the reset signal, which has the electric potential level obtained by inverting the reset signal representing the reset-on state and represents reset release, is input, the electric potential level of the node has the potential level obtained by inverting the reset signal, and the fuse is not cut, the closed loop which is composed of the second p-channel transistor and the inverter latches this electric potential level and outputs a repair signal obtained by inverting this electric potential level from the inverter. Meanwhile, when the fuse is cut, the closed loop which is composed of the second p-channel transistor and the inverter is maintained in a state at the time of the initialization, and a repair signal obtained by inverting the reset signal representing the reset release is output from the inverter. Here, in the case where the reset signal representing the reset release is input and the fuse is connected, since on-resistance of the second p-channel transistor is higher than on-resistance of the n-channel transistor, an unstable state of electricity at the node is eliminated by a voltage dividing ratio of the voltages of the on-resistance so that a repair signal which represents the connection of the fuse can be output securely and stably.

Further, a capacitor is provided between the power supply and the node. Because of the provision of this capacitor, fluctuation of the electric potential at the node is suppressed to minimum just after the reset is released.

Further, a delay circuit for delaying the reset signal representing the reset release is provided. The delay circuit delays the reset signal representing the reset release after the repair signal is defined by the reset release and outputs the reset signal to the circuits other than the repair signal generating circuit on the semiconductor integrated circuit so that the repair operation and the reset releasing operation using the repair signal do not compete against each other.

Further, the delay circuit comprises at least a plurality of stages of flip-flop circuits; and the reset signal representing the reset release is delayed and output in synchronization with a system clock to be supplied to the semiconductor integrated circuit. Thus, delay time of the reset signal representing the reset release can be set optimally by a period of a system clock and a number of stages of flip-flop circuits.

The repair signal generating circuit further comprises a second flip-flop circuit for latching and outputting a repair signal output by the inverter in response to reset signals output by the plurality of stages of flip-flop circuits; a third flip-flop circuit for further delaying the reset signals output by the plurality of stages of flip-flop circuits; and a reset signal input circuit for obtaining AND of an inverted signal of the reset signal output by the third flip-flop circuit and the reset signal input by the repair signal generating circuit, and outputting the AND result to the gates of the first p-channel transistor and the n-channel transistor. Accordingly, when the reset signal representing the reset release is input into the gates of the first p-channel transistor and n-channel transistor based on the reset signal representing the reset-on state via the reset signal input circuit, the repair signal corresponding to the cut state of the fuse is output from the inverter. Thereafter, the second flip-flop circuit latches the repair signal output from the inverter in response to the reset signals which are delayed and output by the plurality of stages of the flip-flop circuits. Thereafter, the third flip-flop circuit further delays the reset signals which were delayed and output by the plurality of stages of the flip-flop circuits, and the reset signal input circuit obtains AND of the inverted signal of the reset signal delayed and output by the third flip-flop circuit and the reset signal input into the repair signal generating circuit so as to output the AND result to the gates of the first p-channel transistor and n-channel transistor, and the repair signal generating circuit is reset again. Therefore, even if a high-resistance state is obtained because the fuse is not cut completely, since the n-channel transistor is made OFF, even a very low electric current does not flow through the fuse. Meanwhile, before the reset signal generating circuit is reset again by the reset signal input circuit, the second flip-flop circuit latches the repair signal according to the cut state of the fuse so that a normal repair signal is output.

Other objects and features of this invention will become apparent from the following description with reference to the accompanying drawings.

DESCRIPTION OF THE PREFERRED EMBODIMENTS

There will be detailed below a repair signal generating circuit according to four preferred embodiments of the present invention with reference to attached drawings.

Figure 1A:
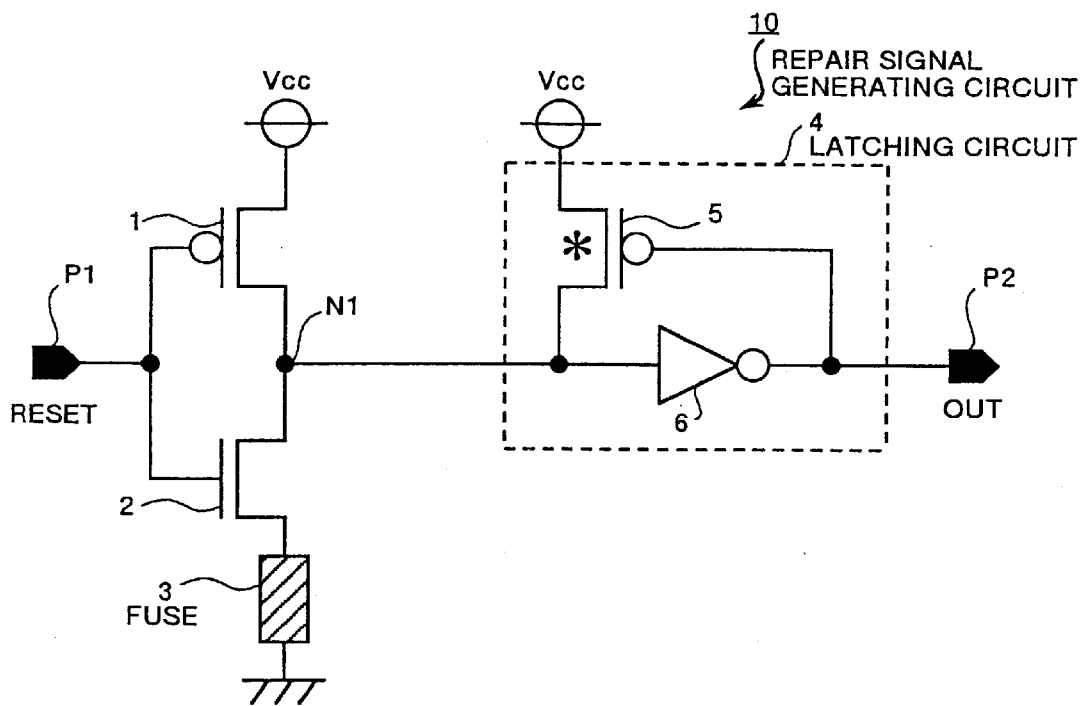
FIG. 1A and FIG. 1B are circuit diagrams showing a configuration of a repair signal generating circuit according to a first embodiment of the present invention.
Figure 1B:
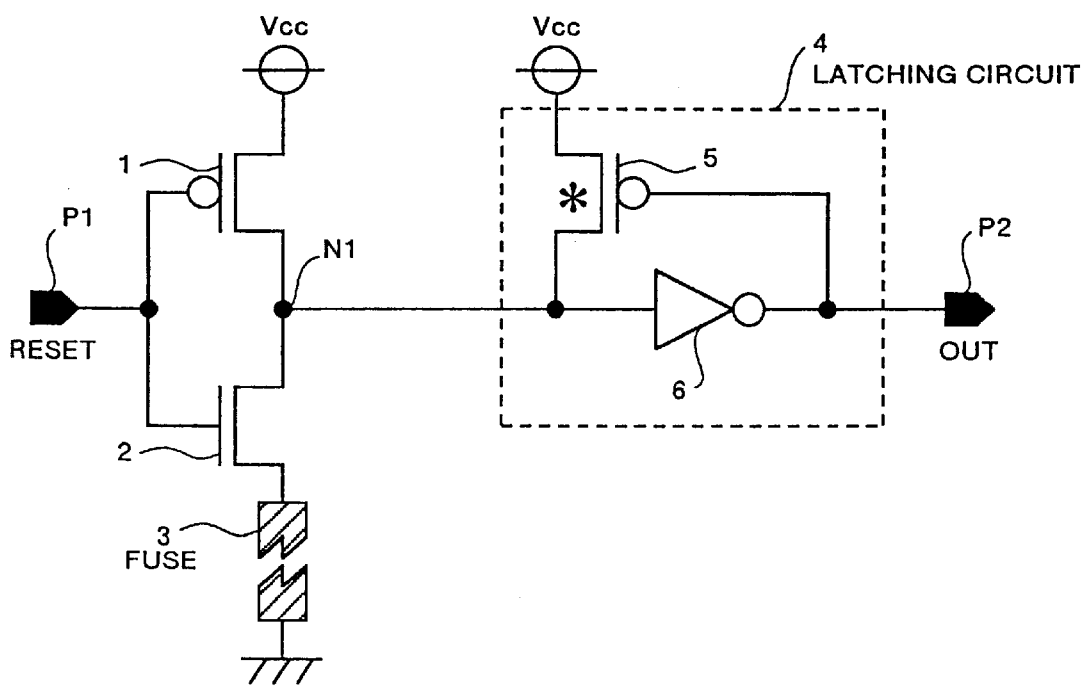

FIG. 1A and FIG. 1B are circuit diagrams showing a configuration of the repair signal generating circuit according to the first embodiment of the present invention. In these figures, the source of a p-channel transistor 1 is connected with a power supply Vcc, and a reset signal RESET is input from a terminal P1 into gate of the p-channel transistor 1. The source of an n-channel transistor 2 is connected with a grounded fuse 3, the drain is connected to the drain of the p-channel transistor 1, and a reset signal RESET is input from the terminal P1 the gate of the n-channel transistor 2.

The input side of an inverter 6 is connected with a node N1 between the p-channel transistor 1 and the n-channel transistor 2. A repair signal OUT is output from the inverter 6 via a terminal P2. The source of a p-channel transistor 5 is connected with a power supply Vcc, and its drain is connected with the node N1, and its gate is connected with output side of the inverter 6. The driving ability of the p-channel transistor 5 is lower than the driving ability of the n-channel transistor 2. That is, on-resistance of the p-channel transistor 5 is larger than the on-resistance of the n-channel transistor 2.

FIG. 1A shows a configuration of the repair signal generating circuit 10 when the fuse 3 is not cut, and FIG. 1B shows the same when the fuse 3 is cut. At first, there will be described below an operation of the repair signal generating circuit 10 in the state that the fuse 3 is not cut with reference to FIG. 1A. In FIG. 1A, in the state that the fuse 3 is not cut, that is, the fuse 3 is connected, a high level repair signal OUT is output finally. Here, a reset signal RESET of a system is supplied to a not shown semiconductor integrated circuit to which the repair signal generating circuit 10 is mounted. The reset signal RESET is a signal which initializes an internal state of the semiconductor integrated circuit. When the reset signal is at low level, the system is forcibly resets.

The reset signal RESET is input into the terminal P1. In the case where the system reset is ON, the reset signal RESET is at low level, and the p-channel transistor 1 is made ON, and the n-channel transistor 2 is made OFF. In this case, voltage of the level of the power supply Vcc is applied to the node N1, and the node N1 is brought into high level, and a high level reset signal is input into the inverter 6.

Accordingly, the inverter 6 outputs an inverted reset signal of low level, and the p-channel transistor 5 is made ON. As a result, since the input side of the inverter 6 is at high level again, a closed loop of a latching circuit 4 which is composed of the inverter 6 and the p-channel transistor 5 keeps the output of the inverter 6 in low level, and the low level repair signal OUT is output from the terminal P2.

When the reset signal RESET is changed from low level into high level and the reset is released, the p-channel transistor 1 is made OFF, and the n-channel transistor 2 is made ON. As mentioned above, since the p-channel transistor 5 is ON at the time of reset-on by the closed loop of the latching circuit 4 which is composed of the inverter 6 and the p-channel transistor 5, just after the reset is released, that is, at the moment that the reset signal RESET is changed from low level into high level, an electric current path is formed via the power supply Vcc, the p-channel transistor 5, the node N1, the n-channel transistor 2, the fuse 3 and the ground.

Here, since the driving ability of the p-channel transistor 5 is lower than the driving ability of the n-channel transistor 2, that is, the on-resistance of the p-channel transistor 5 is higher than the on-resistance of the n-channel transistor, the node N1 comes closer to a grounding level due to a voltage dividing ratio of the voltages of the on-resistance so as to be changed into low level.

As a result, thereafter the output of the inverter 6 is changed into high level, and the p-channel transistor 5 is changed into OFF state. When the p-channel transistor 5 is changed into OFF state, the electric current path via the power supply Vcc, p-channel transistor 5, node N1, n-channel transistor 2, fuse 3 and ground is cut, and the node N1 is finally brought into low level by the ground via the n-channel transistor 2 and the fuse 3. For this reason, the input side of the inverter 6 is brought into low level again, and the closed loop of the latching circuit 4 which is composed of the inverter 6 and the p-channel transistor 5 holds the output of the inverter 6 in high level. As a result, the high level repair signal OUT is continued to be output from the terminal P2.

Next, there will be described below an operation of the repair signal generating circuit 10 in the state that the fuse 3 is cut with reference to FIG. 1B. In FIG. 1B, in the state that the fuse 3 is cut, the low level repair signal OUT is finally output. In the case where the reset is in ON state, that is, the reset signal RESET is at low level, the operation here is the same as the above-mentioned operation in the state that the fuse 3 is not cut. That is, when the low level reset signal RESET is input into the terminal P1, the p-channel transistor 1 is brought into ON state, and the n-channel transistor 2 is brought into OFF state.

In this case, a voltage with the same level as the power supply Vcc is applied to the node N1, and the node N1 is brought into high level, and this high level signal is input into the inverter 6. Accordingly, the inverter 6 outputs an inverted low level signal, and the p-channel transistor 5 is brought into ON state. As a result, since the input side of the inverter 6 is brought into high level, the closed loop of the latching circuit 4 which is composed of the inverter 6 and the p-channel transistor 5 holds the output of the inverter 6 in low level, and the low level repair signal OUT is output from the terminal P2.

When the reset signal RESET is changed from low level into high level and the reset is released, the p-channel transistor 1 is brought into OFF state, and the n-channel transistor 2 is brought into ON state. Here, since the fuse 3 is cut, the inverter 6 is not driven by the p-channel transistor 1 as well as the n-channel transistor 2 which is in ON state.

Meanwhile, at the time of reset-on, since the p-channel transistor 5 holds ON state, even after the reset is released, the node N1 is maintained in the power supply level due to the power supply Vcc, that is, high level. For this reason, the input side of the inverter 6 is held in high level, and the closed loop of the latching circuit 4 which is composed of the inverter 6 and the p-channel transistor 5 holds the output of the inverter 6 at low level, and the low level repair signal OUT is continued to be output from the terminal P2.

As a result, in the state that the fuse 3 is not cut, after the reset is released, the high level repair signal OUT is continued to be output, and in the state that the fuse 3 is cut, after the reset is released, the low level repair signal OUT is continued to be output.

According to the first embodiment, since after the reset is released, no electric current path is no generated regardless of the cut of the fuse 3, the repair signal generating circuit in which the power consumption is lowered can be realized. Moreover, since the reset signal RESET securely initializes the latching circuit 4, the operation of the repair signal generating circuit 10 is stabilized. As a result, even in the case where circuits have uneven quality in the semiconductor fabricating process, the yield of the repair signal circuit itself can be improved.

There will be described below a second embodiment of the present invention. In the second embodiment, a capacitor, which stabilizes a voltage level of the node N1 of the repair signal generating circuit 10 shown in FIG. 1A and FIG. 1B for fixed time, is provided.

Figure 2A:
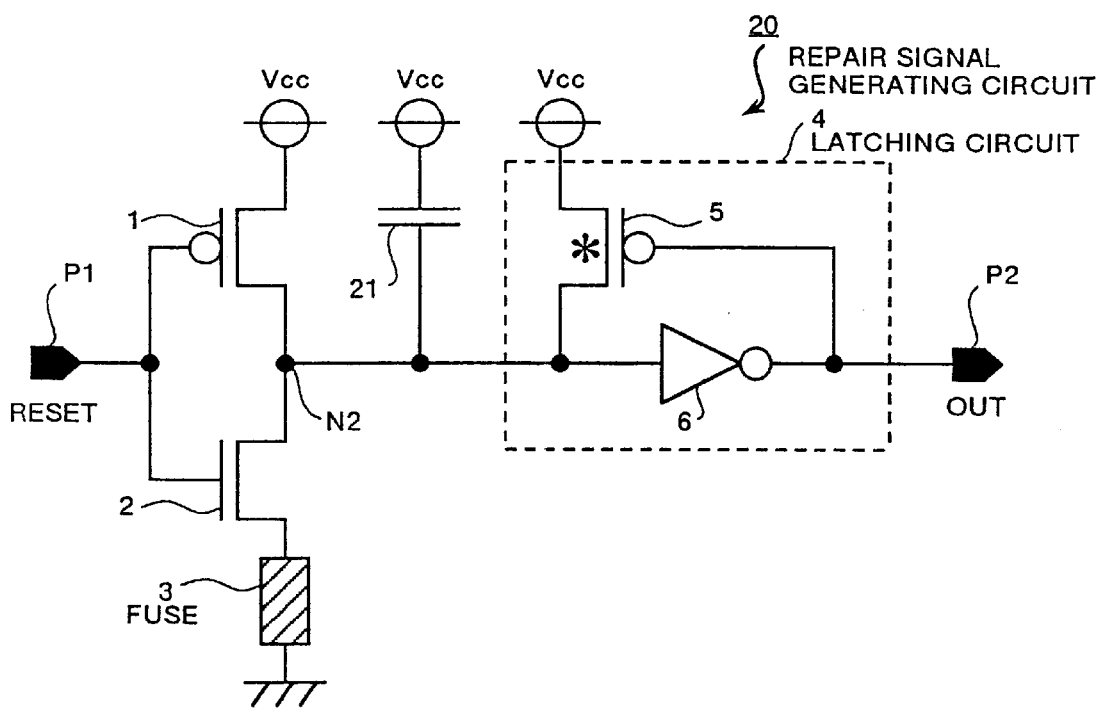
FIG. 2A and FIG. 2B are circuit diagrams showing a configuration of the repair signal generating circuit according to a second embodiment of the present invention.
Figure 2B:
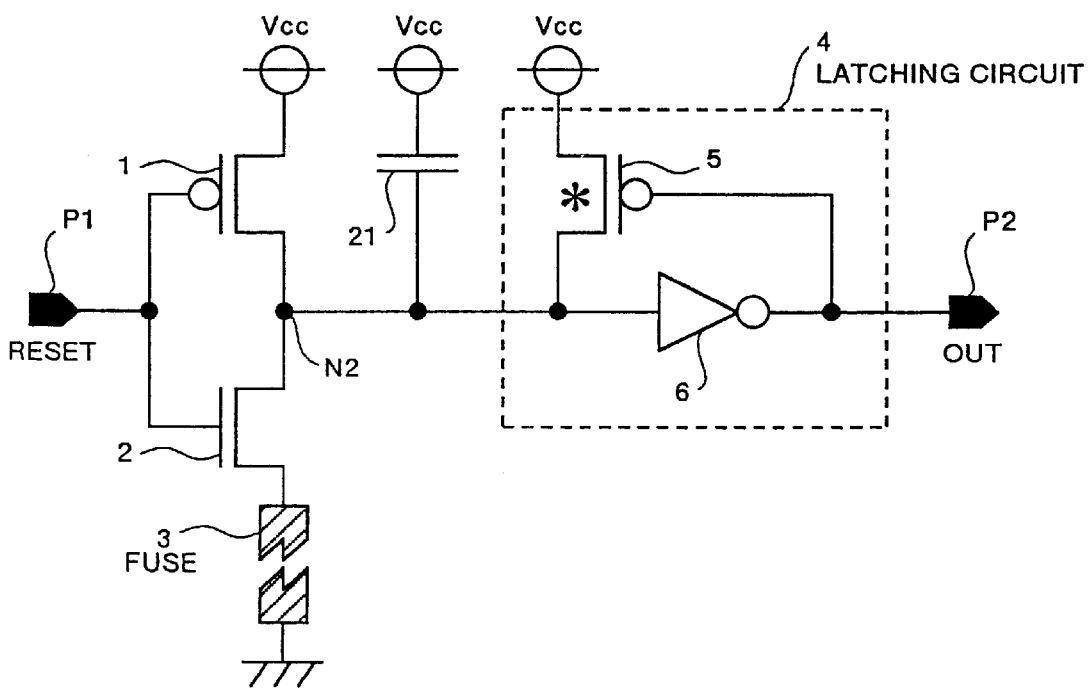

FIG. 2A and FIG. 2B are circuit diagrams showing a configuration of the repair signal generating circuit according to the second embodiment of the present invention. FIG.

2A shows a configuration of the repair signal generating circuit in the state that the fuse 3 is not cut, and FIG. 2B shows the same in the state that the fuse 3 is cut. A repair signal generating circuit 20 shown in FIG. 2A and FIG. 2B is constituted so that a capacitor 21 is further connected between a node N2 corresponding to the node N1 of the repair signal generating circuit 10 shown in FIG. 1A and the power supply Vcc. The provision of the capacitor 21 enables a change in the electric potential of the node N2 to be slow. The other parts of the configuration are the same as those of the repair signal generating circuit 10 shown in FIG. 1A, and the same reference numerals are given to the same components.

At first, there will be described below an operation of the repair signal generating circuit 20 in the state that the fuse 3 is not cut with reference to FIG. 2A. At the time of reset-on, that is, in the case where the reset signal RESET is at low level, the node N2 which is connected with the capacitor 21 and the input side of the inverter 6 is brought into high level, and the closed loop of the latching circuit 4 makes a low level repair signal OUT to be output from the terminal P2. In this case, the capacitor 21 is charged to high level.

Since after the reset is released, that is, the reset signal RESET is changed from low level into high level, on-resistance of the p-channel transistor 5 is higher than on-resistance of the n-channel transistor 2, the node N2 is changed into low level by a voltage dividing ratio of the voltage of the on-resistance on the electric current path via the power supply Vcc, the p-channel transistor 5, the node N2, the n-channel transistor 2, the fuse 3 and the ground. As a result, the output of the inverter 6 is changed into high level, and the p-channel transistor 5 is made OFF state.

When the p-channel transistor 5 is OFF, the electric current path through the power supply Vcc, the p-channel transistor 5, the node N2, the n-channel transistor 2, the fuse 3 and the ground is cut, and the node N1 is finally brought into low level by the ground through the n-channel transistor 2 and the fuse 3. For this reason, the input side of the inverter 6 is again at low level, and the closed loop of the latching circuit 4 which is composed of the inverter 6 and the p-channel transistor 5 holds the output of the inverter 6 in high level so that a high level repair signal OUT is continued to be output from the terminal P2.

Next, there will be described below an operation of the repair signal generating circuit 20 in the state that the fuse 3 is cut with reference to FIG. 2B. At the time of reset-on, the node N2 which is connected with the capacitor 21 and the input side of the inverter 6 is brought into high level by the low level reset signal RESET similarly to the state that the fuse is not cut. Then a low level repair signal OUT is output from the terminal P2 by the closed loop of the latching circuit 4. In this case, the capacitor 21 is charged to high level.

When the reset is released, that is, after the reset signal RESET is changed from low level into high level, the fuse 3 is cut, and the p-channel transistor 1 is in OFF state. For this reason, the inverter 6 is not driven by the n-channel transistor 2 and p-channel transistor 1. Here, at the moment of the changeover from the reset-on state to the reset-released state, since the n-channel transistor 2 is changed from OFF state into ON state, an electric charge is again allocated at the node N2 in a vicinity of the n-channel transistor 2. However, since the capacitor 21, which has sufficiently larger electric capacity than electric capacity for allocating the electric charge again, is connected with the node N2, a change in the electric potential at the node N2 due to re-allocation of the electric charge can be attenuated.

Here, since the p-channel transistor 5 is held in ON state, even after the reset is released, the node N2 is maintained in the power supply level by means of the power supply Vcc, that is, at high level. For this reason, the input side of the inverter 6 is maintained in high level, and the closed loop of the latching circuit 4 which is composed of the inverter 6 and the p-channel transistor 5 holds the output of the inverter 6 in low level so that the low level repair signal OUT is continued to be output from the terminal P2.

When the electric potential of the node N2 is in low level even for an instant, high level which was inverted by the latch circuit 4 is latched. For this reason, although the fuse 3 is cut, the repair signal OUT representing that the fuse 3 is connected is output.

As a result, in the state that the fuse 3 is not cut, after the reset is released, the high level repair signal OUT is continued to be output, and in the state that the fuse 3 is cut, after the reset is released, the low level repair signal OUT is continued to be output. Particularly, the low level repair signal OUT can be output stably when the reset is released in the state that the fuse 3 is cut.

According to the second embodiment, similarly to the first embodiment, after the reset is released, since no electric path is generated regardless of cutting of the fuse 3, the repair signal generating circuit in which the power consumption is lowered can be realized. At the same time, since the reset signal RESET initializes the latching circuit 4 securely, the operation of the repair signal generating circuit 10 is stabilized. As a result, even in the case where circuits have uneven quality in the semiconductor fabricating process, the yield of the repair signal circuit itself can be improved. Moreover, since the capacitor 21 attenuates the fluctuation of the voltage of the node N2 just after the reset is released, the cutting of the fuse 3 can be detected stably.

There will be described below a third embodiment of the present invention. In the third embodiment, after a repair signal which is supplied by the repair signal generating circuit is defined, a reset signal for instructing the reset to be released is supplied to another circuits on a semiconductor integrated circuit on which the repair signal generating circuit is mounted, thereby avoiding a timing-critical operation due to competition between a repair operation based on the repair signal and a reset release operation by means of the other circuits on the semiconductor integrated circuit.

Figure 3:
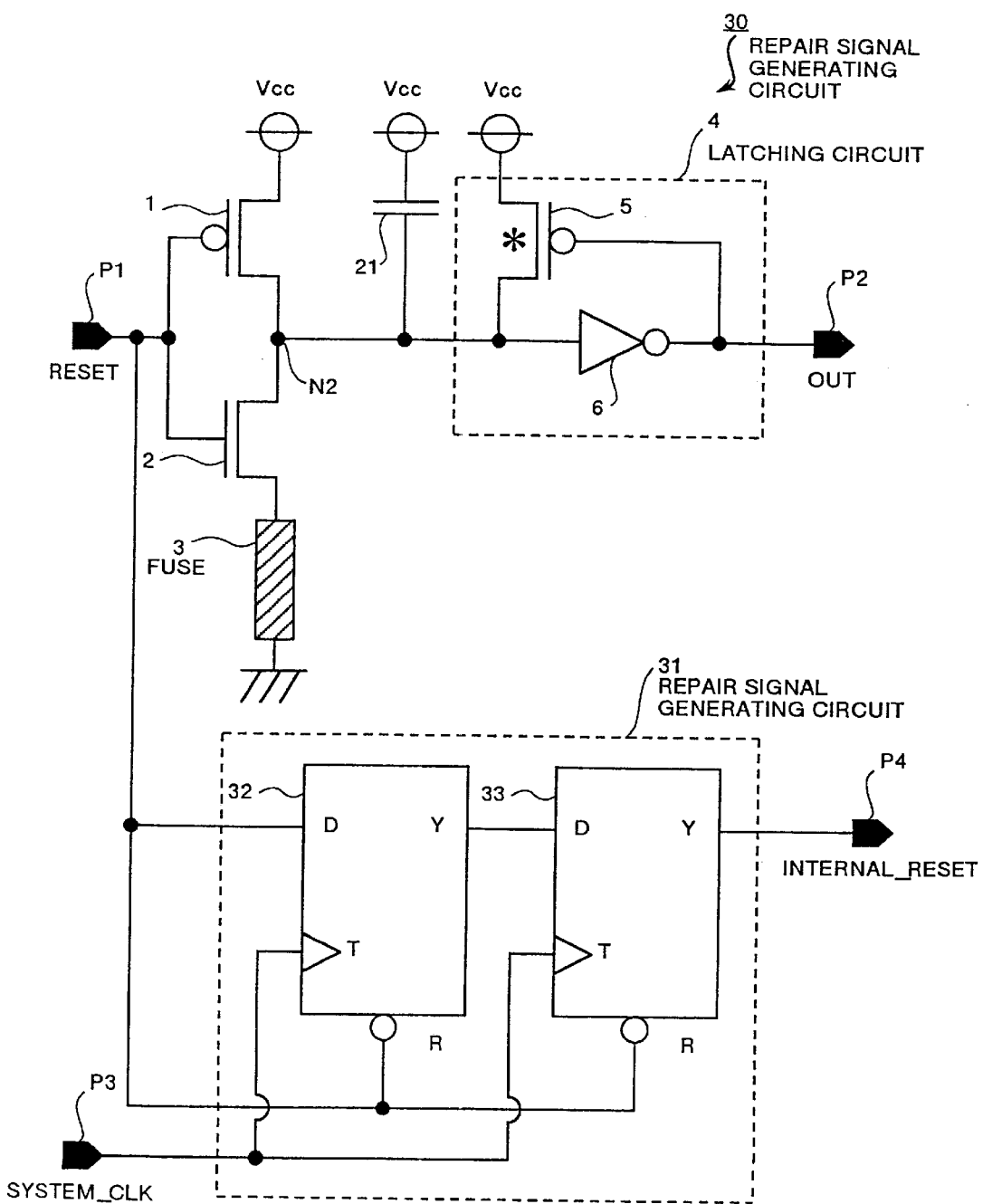
FIG. 3 is a circuit diagram showing a configuration of the repair signal generating circuit according to a third embodiment of the present invention.

FIG. 3 is a circuit diagram showing a configuration of the repair signal generating circuit according to the third embodiment of the present invention. The repair signal generating circuit 30 shown in FIG. 3 is constituted so that a reset signal generating circuit 31 is added to the repair signal generating circuit 20 shown in FIG. 2A.

The reset signal generating circuit 31 has two flip-flop circuits 32 and 33. These flip-flop circuits 32 and 33 are cascade-connected with each other. A system clock SYSTEM_CLK is supplied to terminals T of the flip-flop circuits 32 and 33 through a terminal P3. Moreover, a reset signal RESET is supplied to terminals R and terminals D of the flip-flop circuits 32 and 33. Further, an output from a terminal Y as an output terminal of the flip-flop circuit 32 is input to the terminal D of the flip-flop circuit 33, and a reset signal INTERNAL_RESET is output from a terminal Y of the flip-flop circuit 33 to not shown circuits other than the repair signal generating circuit on the semiconductor integrated circuit through a terminal P4.

The flip-flop circuits 32 and 33 latch data input into the terminals D in synchronization with leading of the system clock SYSTEM_CLK, and outputs the latched data from the terminals Y. Moreover, when low level data are supplied to the terminals R, high level data obtained by inverting the low level data are input, and the flip-flop circuits 32 and 33 forcibly output the low level outputs from the terminals Y.

When the reset signal RESET input from the terminal P1 is at low level, that is, the reset is ON, a low level reset signal RESET is input into the terminals R of the flip-flop circuits 32 and 33 of the reset signal generating circuit 31, and the low level reset signal INTERNAL_RESET is output. When the reset signal INTERNAL_RESET is at low level, all the circuits other than the repair signal generating circuit on the semiconductor integrated circuit are initialized.

When the reset signal RESET releases the reset and changeover from low level to high level occurs, the reset of the repair signal generating circuit is released. In the case where the fuse 3 is not cut, the high level repair signal OUT is output, and in the case where the fuse 3 is cut, the low level repair signal OUT is output. At this time, the reset signal generating circuit 31 is held in low level, and the circuits other than the repair signal generating circuit on the semiconductor integrated circuit are still in the reset state.

Thereafter, when the system clock SYSTEM_CLK is started to be supplied from the terminal P3, the flip-flop circuit 32 latches the reset signal RESET at the first leading of the system clock SYSTEM_CLK. At this time, since the reset is released, the reset signal RESET to be latched is high level data. When the second leading of the system clock SYSTEM_CLK is input into the flip-flop circuits 32 and 33, the flip-flop circuit 33 latches the high level data input from the flip-flop circuit 32 and outputs a high level reset signal INTERNAL_RESET.

As a result, the reset state of the circuits other than the repair signal generating circuit on the semiconductor integrated circuit is released. In this case, the repair signal OUT which was defined by releasing the reset is first output to the circuits other than the repair signal generating circuit on the semiconductor integrated circuit, and the reset signal INTERNAL_RESET is delayed according to the system clock SYSTEM_CLK and a number of stages of the flip-flop circuits 32 and 33 so as to be output from the reset signal generating circuit 31.

In other words, after an external reset signal RESET to be input into the semiconductor integrated circuit is released and the reset of the repair signal generating circuit is released and the circuits in the semiconductor integrated circuit are relieved according to the cutting/non-cutting of the fuse 3, the circuits in the semiconductor integrated circuit are actuated with them being delayed according to the system clock SYSTEM_CLK and a number of stages of the flip-flop circuits 32 and 33. For this reason, after the circuits in the semiconductor integrated circuit are repaired completely, the reset state of the circuits other than the repair signal generating circuit on the semiconductor integrated circuit can be released at timing with leeway.

In the above-mentioned third embodiment, a number of stages of the flip-flop circuits 32 and 33 is set to two stages, but a number of stages is not limited to this, and three or more stages of the flip-flop circuits may be connected directly with 5 each other. In this case, a period of the system clock SYSTEM_CLK is added so that a number of stages for obtaining desired delay time may be set.

According to the third embodiment, after the reset signal generating circuit 31 defines the reset release via the repair signal generating circuit and the circuits in the semiconductor integrated circuits are repaired completely, the reset state of the circuits in the semiconductor integrated circuit is released. As a result, the competition between the repair operation and the reset operation is eliminated, and the repair operation and reset operation can be performed at safe timing.

There will be described below a fourth embodiment of the present invention. In the fourth embodiment, in the case where the fuse 3 is not cut completely, a very low electric current to flow on the fuse 3 is prevented from being generated so that the power consumption is lowered.

Figure 4:
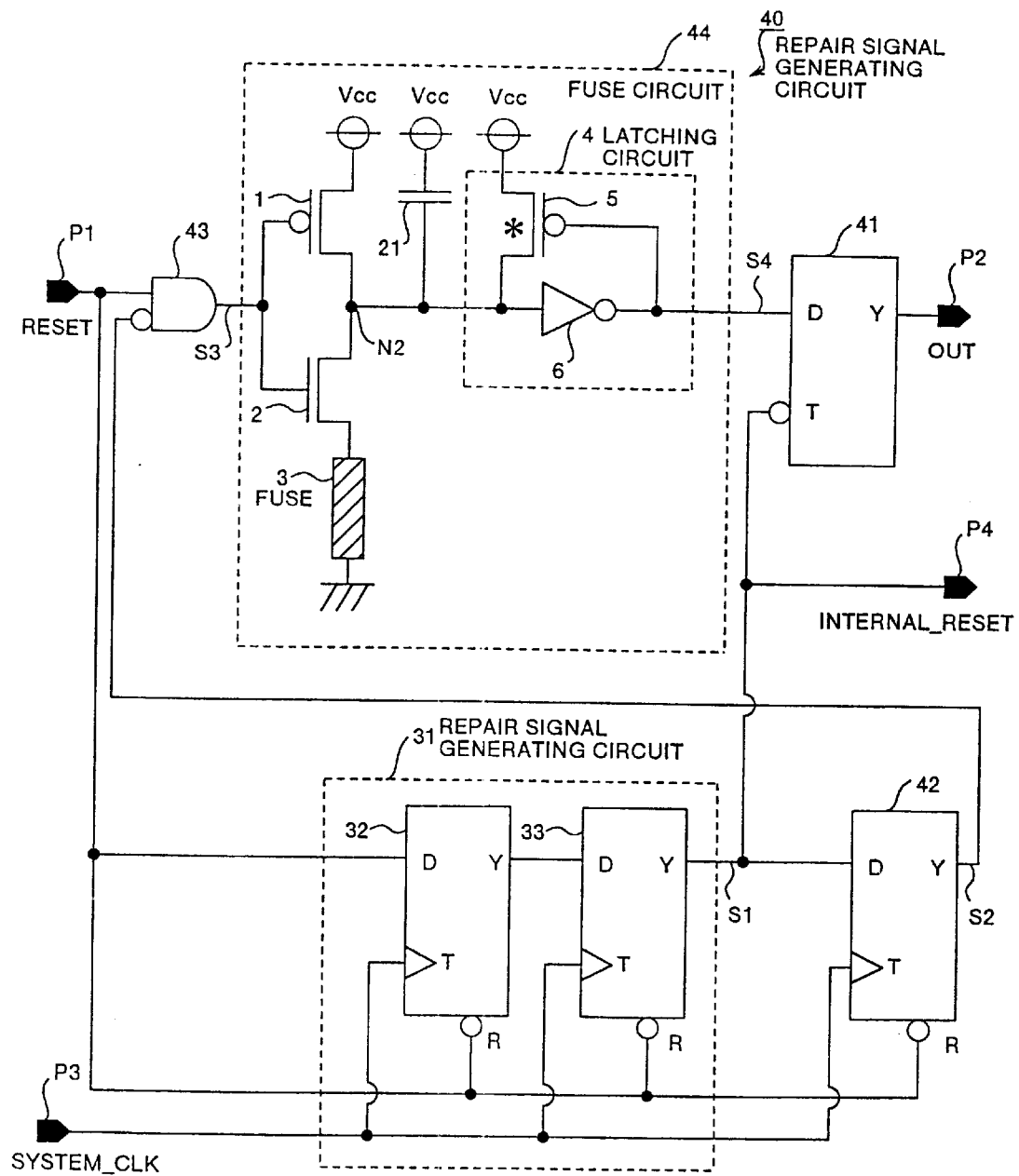
FIG. 4 is a circuit diagram showing a configuration of the repair signal generating circuit according to a fourth embodiment of the present invention.
Figure 5:
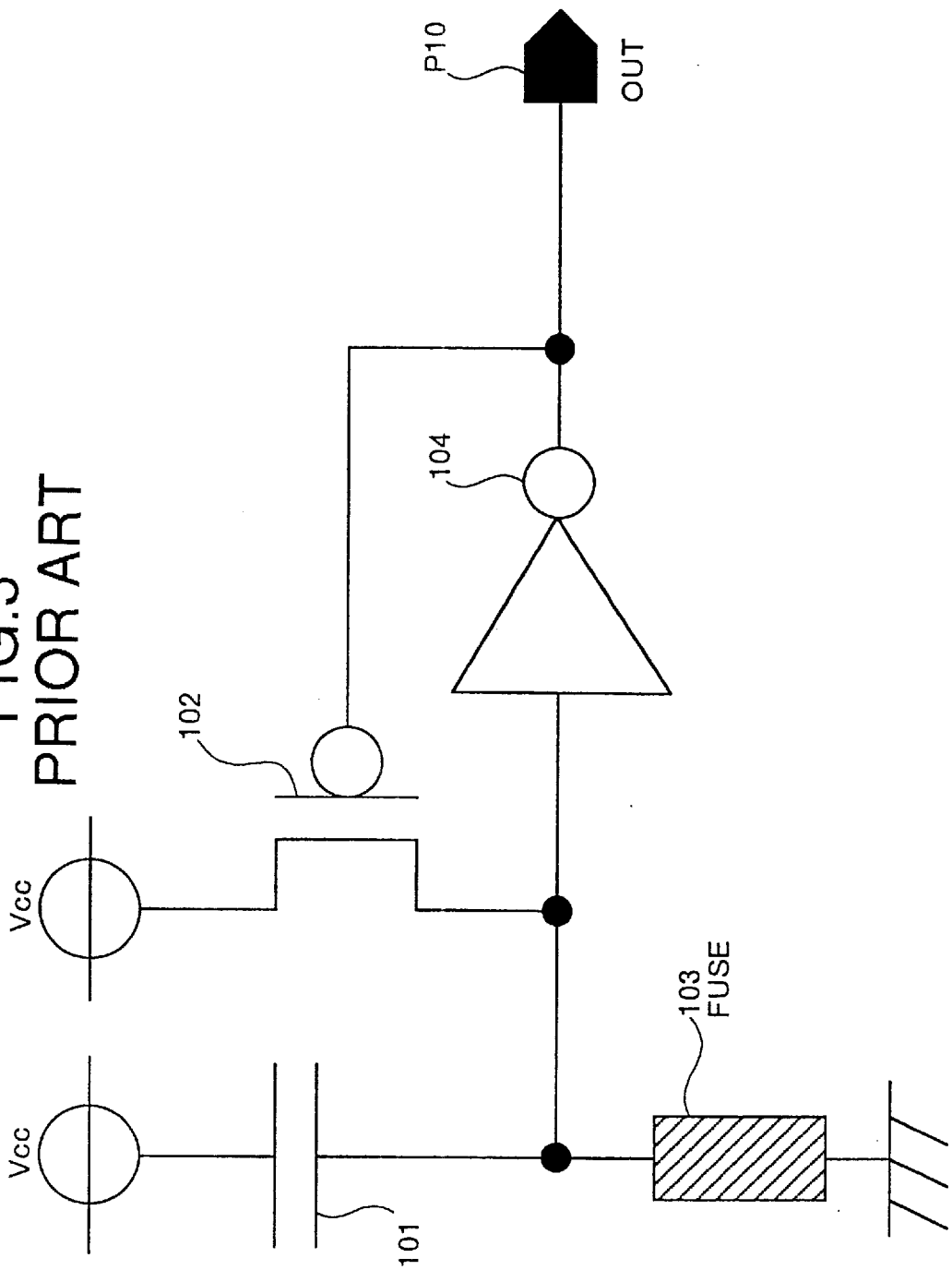
FIG. 5 is a diagram showing a configuration of a conventional repair signal generating circuit.

FIG. 4 is a circuit diagram showing a configuration of the repair signal generating circuit according to the fourth embodiment of the present invention. The repair signal generating circuit 40 shown in FIG. 4 is constituted so that a D-latching circuit 41, a flip-flop circuit 42 and an AND circuit 43 are further added to the repair signal generating circuit 30 shown in FIG. 3. The other parts of the configuration are the same as those of the repair signal generating circuit 30 shown in FIG. 3, and the same reference numerals are given to the same components.

As shown in FIG. 4, the flip-flop circuit 42 is connected with a backward stage of the flip-flop circuit 33 in the reset signal generating circuit 31. A system clock SYSTEM_CLK is supplied to a terminal T of the flip-flop circuit 42 via the terminal P3. Moreover, a reset signal RESET is supplied to a terminal R of the flip-flop circuit 42 through the terminal P1. Further, an output from the terminal Y of the flip-flop circuit 33 is input into a terminal D of the flip-flop circuit 42, and a reset signal S2 output from the terminal Y of the flip-flop circuit 42 is inverted and input into the AND circuit 43.

The reset signal RESET from the terminal P1 is input into the AND circuit 43, and a reset signal S2 which is delayed by 3 clocks of the system clock SYSTEM_CLK is input from the flip-flop circuit 42 into the AND circuit 43. For this reason, the reset signal RESET from the terminal P1 is input directly into the fuse circuit 44, and a repair signal S4 in accordance with the cutting/non-cutting of the fuse 3 is output to the D-latching circuit 41. Thereafter, an inverted signal of the high level reset signal S2 which is delayed by 3 clocks of the system clock SYSTEM_CLK is input into the other terminal of the AND circuit 43, and a reset signal S3 which represents low level reset-on state is input into the fuse circuit 44 again in accordance with the input of the reset signal S2. As a result, the fuse circuit 44 is brought into the reset state.

Before the inverted signal of the reset signal S2 is input into the AND circuit 43 and the fuse circuit 44 is in the reset state, the inverted signal of the reset signal S1 output from the terminal Y of the flip-flop circuit 33 is input into a terminal T of the D-latching circuit 41. The reset signal S1 is determined as a latch clock, and when the reset signal S1 is at low level, the reset signal S4 to be output to the terminal D is taken, and when the reset signal S1 is at high level, data of the taken reset signal S4 are latched so as to be output as a repair signal OUT. That is, the D-latching circuit 41 takes the repair signal S4 which was judged by the fuse circuit 44 securely until 2 clocks of the system clock SYSTEM_CLK passes, and outputs the latched reset signal OUT to the terminal P2 after 2 clocks of the system clock SYSTEM_CLK passes.

In addition, the reset signal S1 output from the flip-flop circuit 33 is a signal which is delayed by 2 clocks of the system clock SYSTEM_CLK, and before the fuse circuit 44 is again reset by the reset signal S2, the normal repair signal S4 in accordance with the cut state of the fuse 3 is taken securely by the D-latching circuit 41. Meanwhile, as for the reset signal S1, the reset signal RESET input from the terminal P1 is output as reset signal INTERNAL_RESET which is delayed by 2 clocks of the system clock SYSTEM_CLK to the terminal P4.

As a result, even in the case, for example, where the fuse of the fuse circuit 44 is not cut completely and it has high resistance of several dozens MΩ, since the n-channel transistor 2 is brought into OFF state, a path on which a very low electric current flows is not formed via the power supply Vcc, the node N2 and the fuse 3. As a result, low power consumption is improved. Meanwhile, as mentioned above, the D-latching circuit 41 takes the normal repair signal S4 in accordance with the cut state of the fuse 3 securely so as to output it as the repair signal OUT to the terminal P2.

In the above-mentioned fourth embodiment, the D-latching circuit 41 outputs the repair signal OUT to the terminal P2 with it being delayed by 2 clocks of the system clock SYSTEM_CLK using the inverted signal of the reset signal S1 output by the flip-flop circuit 33 as a latch clock, and simultaneously outputs the reset signal S1 as the reset signal INTERNAL_RESET to the terminal P4. However, the reset signal S2 output from the flip-flop circuit 42 may be output as the reset signal INTERNAL_RESET to the terminal P4. In this case, the competition between the repair operation using the repair signal OUT output from the terminal P2 and the reset operation using the reset signal INTERNAL_RESET output from the terminal P4 can be avoided securely.

According to the fourth embodiment, the D-latching circuit 41 can output the normal repair signal OUT in accordance with the cut state of the fuse 3, and after the D-latching circuit 41 takes the normal repair signal OUT, the AND circuit 43 resets the fuse circuit 44 again so that the n-channel transistor 2 is brought into OFF state. As a result, even in the case where the fuse 3 is not cut completely, an electric current does not flow in the fuse 3 so that the power consumption can be lowered. Further, it is possible to replace the flip-flop circuits 32, 33 and 42 with delay cells.

As mentioned above, according to the present invention, initialization is carried out in such a manner that when a reset signal representing the reset-on state is input into the gates of the first p-channel transistor and n-channel transistor, an electric potential level obtained by inverting the reset signal is generated at the node, and the closed loop which is composed of the second p-channel transistor and the inverter latches the electric potential level and a repair signal having an electric potential level obtained by inverting the electric potential level is output from the inverter. When the reset signal, which has the electric potential level obtained by inverting the reset signal representing the reset-on state and represents reset release, is input, the electric potential level of the node has the potential level obtained by inverting the reset signal, and in the case where the fuse is not cut, the closed loop which is composed of the second p-channel transistor and the inverter latches this electric potential level and outputs a repair signal obtained by inverting this electric potential level from the inverter. Meanwhile, in the case where the fuse is cut, the closed loop which is composed of the second p-channel transistor and the inverter is maintained in a state at the time of the initialization, and a repair signal obtained by inverting the reset signal representing the reset release is output from the inverter. Here, in the case where the reset signal representing the reset release is input and the fuse is connected, since on-resistance of the second p-channel transistor is higher than on-resistance of the n-channel transistor, an unstable state of electricity at the node is eliminated by a voltage dividing ratio of the voltages of the on-resistance so that a repair signal which represents the connection of the fuse can be output securely and stably. As a result, the secure and stable repair signal can be output by the simple configuration, and after the reset is released, an electric current path from the power supply to ground is not generated regardless of the cutting/non-cutting of the fuse. Therefore, low power consumption can be improved.

Further, since a capacitor is provided between the power supply and the node and a fluctuation of electric potential at the node is suppressed to minimum just after the reset is released, the more secure and stable repair signal can be output.

Further, a delay circuit delays the reset signal representing the reset release after the repair signal is defined by the reset release and outputs the reset signal to the circuits other than the repair signal generating circuit on the semiconductor integrated circuit so that the repair operation and the reset releasing operation using the repair signal do not compete against each other. As a result, the repair operation and reset release operation in the other circuits on the semiconductor integrated circuit can be performed safely.

Further, since delay time of the reset signal representing the reset release can be set optimally by a period of a system clock and a number of stages of flip-flop circuits, the repair operation and reset release operation can be performed more safely.

Further, when the reset signal representing the reset release is input into the gates of the first p-channel transistor and n-channel transistor based on the reset signal representing the reset-on state via the reset signal input circuit, the repair signal corresponding to the cut state of the fuse is output from the inverter. Thereafter, the second flip-flop circuit latches the repair signal output from the inverter in response to the reset signals which are delayed and output by the plurality of stages of the flip-flop circuits. Thereafter, the third flip-flop circuit further delays the reset signals which were delayed and output by the plurality of stages of the flip-flop circuits, and the reset signal input circuit obtains AND of the inverted signal of the reset signal delayed and output by the third flip-flop circuit and the reset signal input into the repair signal generating circuit so as to output the AND result to the gates of the first p-channel transistor and n-channel transistor, and the repair signal generating circuit is reset again. Even in the case where a high-resistance state such that the fuse is not cut completely is obtained, since the n-channel transistor is brought into OFF state, a very low electric current does not flow via the fuse. Meanwhile, before the reset signal generating circuit is reset again by the reset signal input circuit, the second flip-flop circuit latches the repair signal according to the cut state of the fuse so that a normal repair signal is output. As a result, in the case where the fuse is not cut completely, generation of the very low electric current via the fuse is avoided so that the low power consumption can be further improved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A repair signal generating circuit comprising:
   a power supply;
   a first p-channel transistor having a source, a gate, and a drain, wherein said source is connected to said power supply, and a reset signal is input into said gate;

a fuse having a grounded first terminal;

an n-channel transistor, having a source, a gate, and a drain, wherein said source is connected to a second terminal of said fuse, the reset signal is input into said gate, and said drain is connected with said drain of said first p-channel transistor;

a second p-channel transistor having a source, a gate, and a drain, wherein said source is connected to said power supply, said drain is connected to said drains of said first p-channel transistor and said n-channel transistor, said second p-channel transistor having an on-resistance higher than that of said n-channel transistor; and an inverter having an input terminal and an output terminal, wherein said input terminal is connected to said drains of said first p-channel transistor and said n-channel transistor, and said output terminal is connected to said gate of said second p-channel transistor, said inverter outputting a repair signal from said output terminal.

2. The repair signal generating circuit according to claim 1, including a capacitor connected between said power supply and said drains of said first p-channel transistor and said n-channel transistor.

3. The repair signal generating circuit according to claim 1 further comprising a delay circuit for delaying the reset signal representing a reset release, wherein the reset signal representing the reset release is delayed and output to circuits of a semiconductor integrated circuit on which said repair signal generating circuit is mounted.

4. The repair signal generating circuit according to claim 3, wherein said delay circuit comprises a plurality of stages of first flip-flop circuits and the reset signal representing the reset release is delayed and output in synchronization with a system clock supplied to the semiconductor integrated circuit.

5. The repair signal generating circuit according to claim 4 further comprising:

a second flip-flop circuit which latches and outputs the repair signal output by said inverter in response to reset signals output by said plurality of first flip-flop circuits;

a third flip-flop circuit which further delays the reset signals output by said plurality of stages of first flip-flop circuits; and a reset signal input circuit which produces an AND result of an inversion of the reset signal output by said third flip-flop circuit and the reset signal to be input into said repair signal generating circuit, and outputs the AND result to said gates of said first p-channel transistor and said n-channel transistor.

* * * * *